(12) United States Patent
Campbell et al.

(10) Patent No.: US 7,963,119 B2
(45) Date of Patent: Jun. 21, 2011

(54) HYBRID AIR AND LIQUID COOLANT CONDITIONING UNIT FOR FACILITATING COOLING OF ONE OR MORE ELECTRONICS RACKS OF A DATA CENTER

(75) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Woodstock, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 627 days.

(21) Appl. No.: 11/944,680

(22) Filed: Nov. 26, 2007

(65) Prior Publication Data
US 2009/0133866 A1    May 28, 2009

(51) Int. Cl.
*F25D 23/12*    (2006.01)
(52) U.S. Cl. .................. 62/259.2; 165/104.33
(58) Field of Classification Search .................. 62/259.2
See application file for complete search history.

(56) References Cited

U.S. PATENT DOCUMENTS

| | | | |
|---|---|---|---|
| 4,313,310 A * | 2/1982 | Kobayashi et al. ............. | 62/175 |
| 6,807,056 B2 * | 10/2004 | Kondo et al. .................. | 361/689 |
| 6,819,563 B1 | 11/2004 | Chu et al. | |
| 6,973,801 B1 * | 12/2005 | Campbell et al. ............. | 62/259.2 |
| 7,011,143 B2 | 3/2006 | Corrado et al. | |
| 7,088,585 B2 | 8/2006 | Chu et al. | |
| 7,106,590 B2 | 9/2006 | Chu et al. | |
| 2005/0207116 A1 | 9/2005 | Yatskov et al. | |

(Continued)

FOREIGN PATENT DOCUMENTS

EP    0025665    3/1981

(Continued)

OTHER PUBLICATIONS

Campbell et al., "Docking Station with Closed Loop Airflow Path for Facilitating Cooling of an Electronics Rack", U.S. Appl. No. 11/862,328, filed Sep. 27, 2007.

(Continued)

*Primary Examiner* — Cheryl J Tyler
*Assistant Examiner* — Lakiya Rogers
(74) *Attorney, Agent, or Firm* — Dennis Jung, Esq.; Kevin P. Radigan, Esq.; Heslin Rothenberg Farley & Mesiti P.C.

(57) ABSTRACT

A hybrid air and liquid coolant conditioning unit is provided for facilitating cooling of electronics rack(s) of a data center. The unit includes a first heat exchange assembly, including a liquid-to-liquid heat exchanger, a system coolant loop and a facility coolant loop, and a second heat exchange assembly, including an air-to-liquid heat exchanger, an air-moving device, and the facility coolant loop. The system coolant loop provides cooled system coolant to the electronics rack(s), and expels heat in the liquid-to-liquid heat exchanger from the electronics rack(s) to the facility coolant. The air-to-liquid heat exchanger extracts heat from the air of the data center and expels the heat to the facility coolant of the facility coolant loop. The facility coolant loop provides chilled facility coolant in parallel to the liquid-to-liquid heat exchanger and the air-to-liquid heat exchanger. In one implementation, the hybrid coolant conditioning unit includes a vapor-compression heat exchange assembly.

18 Claims, 9 Drawing Sheets

U.S. PATENT DOCUMENTS

2007/0035937 A1  2/2007  Colbert et al.
2008/0068793 A1* 3/2008  Ishimine ...................... 361/688

FOREIGN PATENT DOCUMENTS

JP      04335557    11/1992
JP      2002168479   6/2002

OTHER PUBLICATIONS

Campbell et al., "Docking Station with Hybrid Air and Liquid Cooling of an Electronics Rack", U.S. Appl. No. 11/862,346, filed Sep. 27, 2007.

D. Delia et al., "System Cooling Design for the Water-Cooled IBM Enterprise System/900 Processors", IBM Journal of Research and Development, vol. 36, No. 4, pp. 791-803 (Jul. 1992).

Colbert et al., "Heatsink Apparatus for Applying a Specified Compressive Force to an Integrated Circuit Device", U.S. Appl. No. 11/460,334, filed Jul. 27, 2006.

Notification of Transmittal of the International Search Report and the Written Opinion of the International Searching Authority, or the Declaration, International Application No. No. PCT/EP2008/066167, mailed Apr. 28, 2009.

* cited by examiner

HYBRID AIR AND LIQUID COOLANT CONDITIONING UNIT FOR FACILITATING COOLING OF ONE OR MORE ELECTRONICS RACKS OF A DATA CENTER

TECHNICAL FIELD

The present invention relates in general to apparatuses and methods for facilitating cooling of rack-mounted assemblages of individual electronics units, such as rack-mounted computer server units of a data center.

BACKGROUND OF THE INVENTION

The power dissipation of integrated circuit chips, and the modules containing the chips, continues to increase in order to achieve increases in processor performance. This trend poses a cooling challenge at both the module and system level. Increased air flow rates are needed to effectively cool high power modules and to limit the temperature of the air that is exhausted into the computer center.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel air flow paths, usually front-to-back, impelled by one or more air moving devices (e.g., fans or blowers). In some cases it may be possible to handle increased power dissipation within a single drawer by providing greater air flow, through the use of a more powerful air moving device or by increasing the rotational speed (i.e., RPMs) of an existing air moving device. However, this approach is becoming problematic at the rack level in the context of a computer installation (e.g., data center).

SUMMARY OF THE INVENTION

The sensible heat load carried by the air exiting the rack is stressing the ability of the room air conditioning to effectively handle the load. This is especially true for large installations with "server farms" or large banks of computer racks close together. In such installations, not only will the room air conditioning be challenged, but the situation may also result in recirculation problems with some fraction of the "hot" air exiting one rack unit being drawn into the air inlet of the same rack or a nearby rack. This re-circulating flow is often extremely complex in nature, and can lead to significantly higher rack inlet temperatures than expected. In such installations, liquid cooling (e.g., water cooling) is an attractive technology to assist in managing the higher heat fluxes. The liquid absorbs the heat dissipated by the components/modules in an efficient manner, and the heat can be ultimately transferred from the liquid to an outside environment, whether air or other liquid coolant.

The shortcomings of the prior art are overcome and additional advantages are thus provided through provision of an apparatus for facilitating cooling of one or more electronics racks of a data center. The apparatus includes a hybrid air and liquid coolant conditioning unit. The hybrid air and liquid coolant conditioning unit includes a first heat exchange assembly and a second heat exchange assembly. The first heat exchange assembly includes a liquid-to-liquid heat exchanger, a system coolant loop and a facility coolant loop. When the hybrid air and liquid coolant conditioning unit is operational within the data center, the facility coolant loop receives chilled facility coolant from a source and passes at least a portion thereof through the liquid-to-liquid heat exchanger, and the system coolant loop provides cooled system coolant to the at least one electronics rack, and expels heat via the liquid-to-liquid heat exchanger from the at least one electronics rack to the chilled facility coolant in the facility coolant loop. The second heat exchange assembly includes an air-to-liquid heat exchanger, an air-moving device (for moving air across the air-to-liquid heat exchanger), and the facility coolant loop. When the hybrid air and liquid coolant conditioning unit is operational within the data center, the facility coolant loop receives chilled facility coolant from the source and passes at least a portion thereof through the air-to-liquid heat exchanger. The air-to-liquid heat exchanger extracts heat from air of the data center moving across the air-to-liquid heat exchanger and expels the heat to the chilled facility coolant in the facility coolant loop, thereby facilitating further cooling of the at least one electronics rack. The facility coolant loop provides chilled facility coolant in parallel to the liquid-to-liquid heat exchanger of the first heat exchange assembly and to the air-to-liquid heat exchanger of the second heat exchange assembly. The hybrid air and liquid coolant conditioning unit further includes at least one control valve disposed within the facility coolant loop, wherein the facility coolant loop includes a facility coolant supply line. The facility coolant supply line feeds in parallel a first facility coolant supply inlet line to the liquid-to-liquid heat exchanger and a second facility coolant supply inlet line to the air-to-liquid heat exchanger. The at least one control valve is coupled to at least one of the first facility coolant supply inlet line or the second facility coolant supply inlet line for separately controlling facility coolant flow through at least one of the liquid-to-liquid heat exchanger or the air-to-liquid heat exchanger.

In another aspect, a data center is provided herein which includes at least one electronics rack and a hybrid air and liquid coolant conditioning unit. Each electronics rack of the at least one electronics rack has an air inlet side and an air outlet side, the air inlet and outlet sides respectively enabling ingress and egress of air through the electronics rack. The hybrid air and liquid coolant conditioning unit includes a first heat exchange assembly and a second heat exchange assembly. The first heat exchange assembly includes a liquid-to-liquid heat exchanger, a system coolant loop and a facility coolant loop, and the second heat exchange assembly includes an air-to-liquid heat exchanger, an air-moving device and the facility coolant loop, wherein the facility coolant loop is shared between the first heat exchange assembly and the second heat exchange assembly. When the hybrid air and liquid coolant conditioning unit is operational within the data center, the facility coolant loop receives chilled facility coolant from a source and passes at least a portion thereof through the liquid-to-liquid heat exchanger, and the system coolant loop provides cooled system coolant to the at least one electronics rack, and expels heat via the liquid-to-liquid heat exchanger from the at least one electronics rack to the chilled facility coolant in the facility coolant loop. Further, when the hybrid air and liquid coolant conditioning unit is operational, the air-moving device moves air across the air-to-liquid heat exchanger, and at least a portion of facility coolant from the source passes through the air-to-liquid heat exchanger, where the air-to-liquid heat exchanger extracts heat from air of the data center moving across the air-to-liquid heat exchanger and expels the heat to the chilled facility coolant in the facility coolant loop, thereby further facilitating cooling of the at least one electronics rack. The shared facility coolant loop provides chilled facility coolant in parallel to the liquid-to-liquid heat exchanger of the first heat exchange assembly and to the air-to-liquid heat exchanger of the second heat exchange assembly. The hybrid air and liquid coolant conditioning unit further includes at least one control valve disposed within the facility coolant loop, wherein the facility coolant loop includes a facility coolant supply line. The facility coolant supply line feeds in parallel a first facility coolant supply inlet line to the liquid-to-liquid heat exchanger and a second facility coolant supply inlet line to the air-to-liquid heat exchanger. The at least one control valve is coupled to at least one of the first facility coolant supply inlet line or the second facility coolant supply inlet line for separately controlling facility coolant flow through at least one of the liquid-to-liquid heat exchanger or the air-to-liquid heat exchanger.

In a further aspect, a method of cooling at least one electronics rack of a data center is provided. The method includes: obtaining a hybrid air and liquid coolant conditioning unit, the hybrid air and liquid coolant conditioning unit including a first heat exchange assembly and a second heat exchange assembly, the first heat exchange assembly comprising a liquid-to-liquid heat exchanger, a system coolant loop, and at least a portion of a facility coolant loop, the second heat exchange assembly comprising an air-to-liquid heat exchanger, an air-moving device, and at least a portion of the facility coolant loop; disposing the hybrid air and liquid coolant conditioning unit in operative position with a data center comprising at least one electronics rack; operating the hybrid air and liquid cooling conditioning unit to cool the at least one electronics rack of the data center, the operating including: employing the facility coolant loop to pass at least a portion of chilled facility coolant from a source through the liquid-to-liquid heat exchanger, and controlling the portion passing through the liquid-to-liquid heat exchanger employing at least one control valve of the hybrid air and liquid coolant conditioning unit; providing cooled system coolant to the at least one electronics rack from the liquid-to-liquid heat exchanger, and expelling heat via the liquid-to-liquid heat exchanger from the at least one electronics rack to the chilled facility coolant in the facility coolant loop, wherein the at least one control valve allows adjustment of facility coolant flow through the liquid-to-liquid heat exchanger, thereby allowing control of temperature of system coolant in the system coolant loop for facilitating cooling of at least one electronics rack; and operating the air-moving device to move air across the air-to-liquid heat exchanger while passing at least a portion of chilled facility coolant from the facility coolant loop through the air-to-liquid heat exchanger, wherein the air-to-liquid heat exchanger extracts heat from data center air moving across the air-to-liquid heat exchanger and expels the heat to the chilled facility coolant in the facility coolant loop, thereby further cooling the at least one electronics rack of the data center, wherein the facility coolant loop provides chilled facility coolant in parallel to the liquid-to-liquid heat exchanger of the first heat exchange assembly and to the air-to-liquid heat exchanger of the second heat exchange assembly.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1:
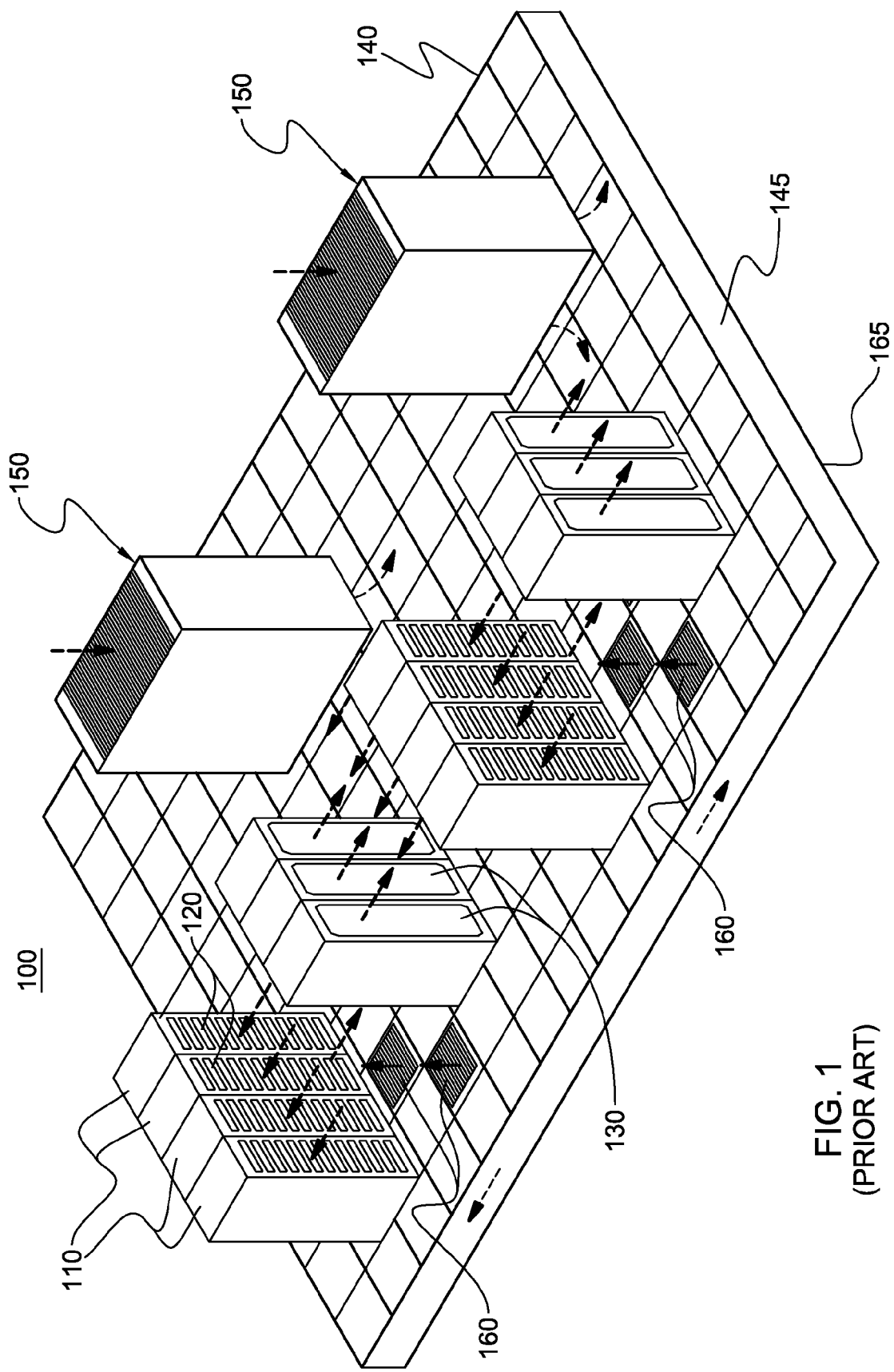
FIG. 1 depicts one embodiment of a conventional raised floor layout of an air-cooled data center.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand alone computer processor having high, mid or low end processing capability. In one embodiment, an electronics rack may comprise multiple electronics subsystems, each having one or more heat generating components disposed therein requiring cooling. "Electronics subsystem" refers to any sub-housing, blade, book, drawer, node, compartment, etc., having one or more heat generating electronic components disposed therein. Each electronics subsystem of an electronics rack may be movable or fixed relative to the electronics rack, with the rack-mounted electronics drawers of a multi-drawer rack unit and blades of a blade center system being two examples of subsystems of an electronics rack to be cooled.

"Electronic component" refers to any heat generating electronic component of, for example, a computer system or other electronics unit requiring cooling. By way of example, an electronic component may comprise one or more integrated circuit dies and/or other electronic devices to be cooled, including one or more processor dies, memory dies and memory support dies. As a further example, the electronic component may comprise one or more bare dies or one or more packaged dies disposed on a common carrier. As used herein, "primary heat generating component" refers to a primary heat generating electronic component within an electronics subsystem, while "secondary heat generating component" refers to an electronic component of the electronics subsystem generating less heat than the primary heat generating component to be cooled. "Primary heat generating die" refers, for example, to a primary heat generating die or chip within a heat generating electronic component comprising primary and secondary heat generating dies (with a processor die being one example). "Secondary heat generating die" refers to a die of a multi-die electronic component generating less heat than the primary heat generating die thereof (with memory dies and memory support dies being examples of secondary dies to be cooled). As one example, a heat generating electronic component could comprise multiple primary heat generating bare dies and multiple secondary heat generating dies on a common carrier. Further, unless otherwise specified herein, the term "liquid-cooled cold plate" refers to any conventional thermally conductive structure having a plurality of channels or passageways formed therein for flowing of liquid coolant therethrough. In addition, "metallurgically bonded" refers generally herein to two components being welded, brazed or soldered together by any means.

As used herein, "air-to-liquid heat exchanger" means any heat exchange mechanism characterized as described herein through which liquid coolant can circulate and which transfers heat between air and the circulating liquid; and includes, one or more discrete air-to-liquid heat exchangers coupled either in series or in parallel. An air-to-liquid heat exchanger may comprise, for example, one or more coolant flow paths, formed of thermally conductive tubing (such as copper or other tubing) in thermal communication with a plurality of air-cooled cooling fins. Size, configuration and construction of the air-to-liquid heat exchanger can vary without departing from the scope of the invention disclosed herein. A "liquid-to-liquid heat exchanger" may comprise, for example, two or more coolant flow paths, formed of thermally conductive tubing (such as copper or other tubing) in thermal communication with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of facility coolant and system coolant is water. However, the concepts disclosed herein are readily adapted to use with other types of coolant on the facility side and/or on the system side. For example, one or more of the coolants may comprise a brine, a fluorocarbon liquid, a liquid metal, or other similar coolant, or refrigerant. In another example described herein, the facility coolant is a refrigerant, while the system coolant is water. All of these variations are possible, while still maintaining the advantages and unique features of the present invention.

Reference is made below to the drawings, which are not drawn to scale for reasons of understanding, wherein the same reference numbers used throughout different figures designate the same or similar components.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within the data center 100. Room air is taken into each air conditioning unit 150 near an upper portion thereof. This room air comprises in part exhausted air from the "hot" aisles of the computer installation defined by opposing air outlet sides 130 of the electronics racks 110.

Figure 2:
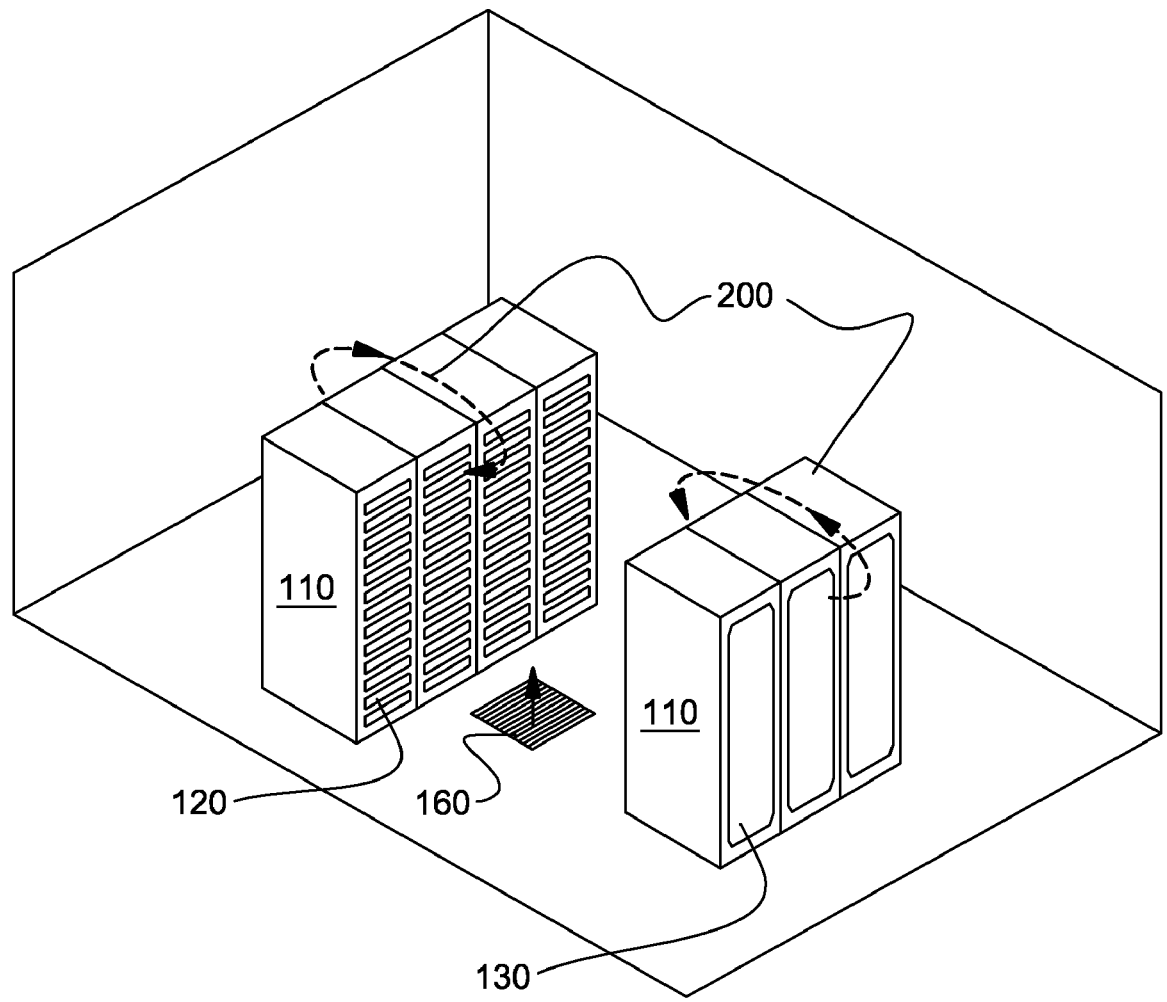
FIG. 2 depicts recirculation airflow patterns to be addressed in one implementation of a raised floor layout of an air-cooled data center, in accordance with an aspect of the present invention.

Due to the ever increasing airflow requirements through electronics racks, and limits of air distribution within the typical data center installation, recirculation problems within the room may occur. This is shown in FIG. 2 for a raised floor layout, wherein hot air recirculation 200 occurs from the air outlet sides 130 of the electronics racks 110 back to the cold air aisle defined by the opposing air inlet sides 120 of the electronics rack. This recirculation can occur because the conditioned air supplied through tiles 160 is typically only a fraction of the airflow rate forced through the electronics racks by the air moving devices disposed therein. This can be due, for example, to limitations on the tile sizes (or diffuser flow rates). The remaining fraction of the supply of inlet side air is often made up by ambient room air through recirculation 200. This recirculating flow is often very complex in nature, and can lead to significantly higher rack unit inlet temperatures than desired.

The recirculation of hot exhaust air from the hot aisle of the computer room installation to the cold aisle can be detrimental to the performance and reliability of the computer system(s) or electronic system(s) within the racks. Data center equipment is typically designed to operate with rack air inlet temperatures in the 18-35° C. range. For a raised floor layout such as depicted in FIG. 1, however, temperatures can range from 15-20° C. at the lower portion of the rack, close to the cooled air input floor vents, to as much as 45-50° C. at the upper portion of the electronics rack, where the hot air can form a self-sustaining recirculation loop. Since the allowable rack heat load is limited by the rack inlet air temperature at the "hot" part, this temperature distribution correlates to an inefficient utilization of available chilled air. Also, computer installation equipment almost always represents a high capital investment to the customer. Thus, it is of significant importance, from a product reliability and performance view point, and from a customer satisfaction and business perspective, to limit the temperature of the inlet air to the rack unit to be substantially uniform. The efficient cooling of such computer and electronic systems, and the amelioration of localized hot air inlet temperatures to one or more rack units due to recirculation of air currents, are addressed by the apparatuses and methods disclosed herein, as is reducing acoustic noise within the data center (e.g., by requiring less cooled air within the data center and less cooled airflow through the electronics racks to remove a given heat load, thereby reducing air-moving device requirements and hence acoustic noise within the data center).

Figure 3:
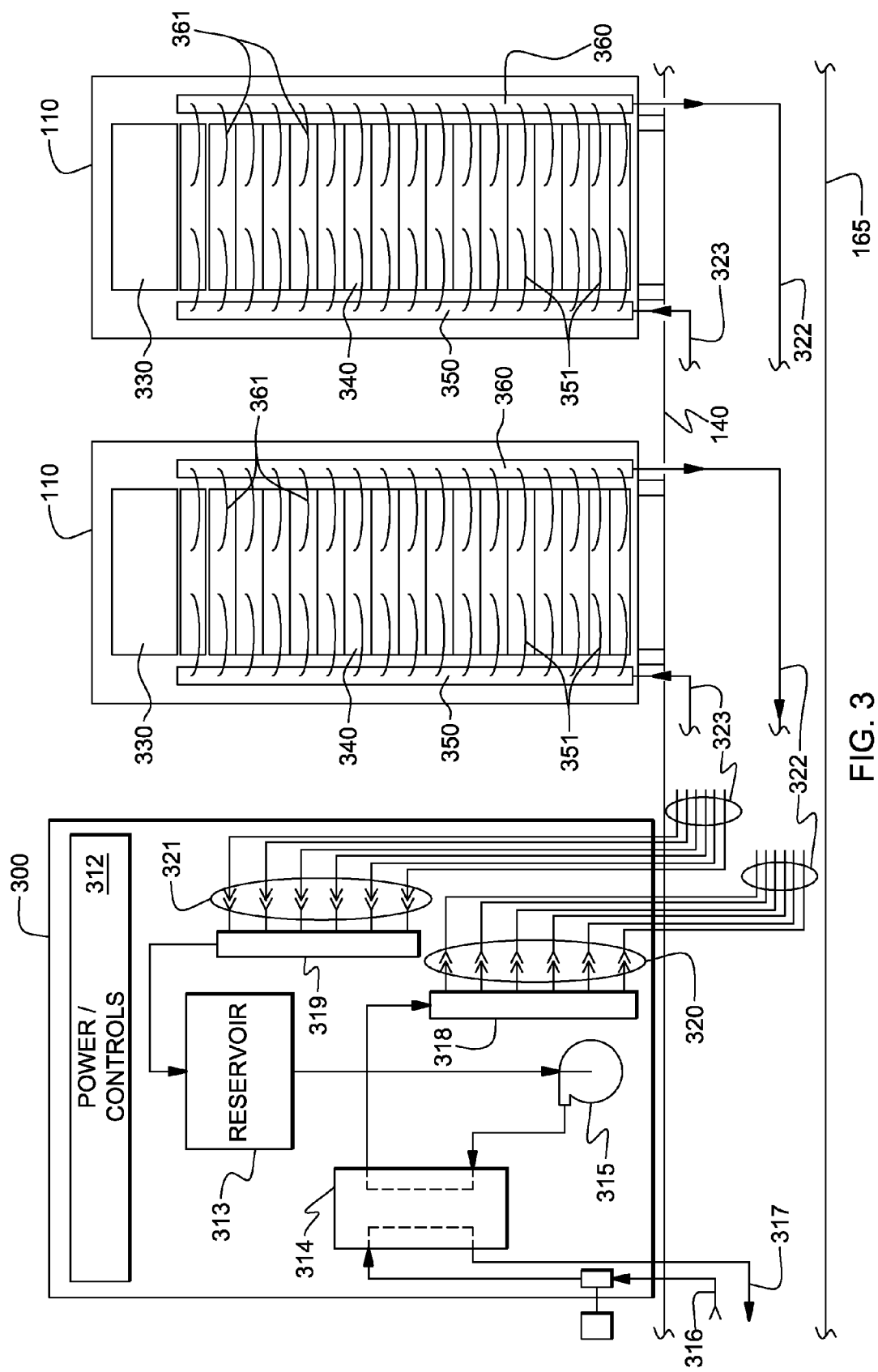
FIG. 3 depicts one embodiment of a coolant distribution unit for liquid cooling of one or more electronics racks of a data center, in accordance with an aspect of the present invention.

FIG. 3 depicts one embodiment of a coolant distribution unit 300 for a data center. The coolant distribution unit is conventionally a large unit which occupies what would be considered a full electronics frame. Within coolant distribution unit 300 is a power/control element 312, a reservoir/expansion tank 313, a heat exchanger 314, a pump 315 (often accompanied by a redundant second pump), facility water inlet 316 and outlet 317 supply pipes, a supply manifold 318 supplying water or system coolant to the electronics racks 110 via couplings 320 and lines 322, and a return manifold 319 receiving water from the electronics racks 110, via lines 323 and couplings 321. Each electronics rack includes (in one example) a power/control unit 330 for the electronics rack, multiple electronics subsystems 340, a system coolant supply manifold 350, and a system coolant return manifold 360. As shown, each electronics rack 110 is disposed on raised floor 140 of the data center and lines 323 providing system coolant to system coolant supply manifolds 350 and lines 322 facilitating return of system coolant from system coolant return manifolds 360 are disposed in the supply air plenum beneath the raised floor.

In the embodiment illustrated, the system coolant supply manifold 350 provides system coolant to the cooling systems of the electronics subsystems (more particularly, to liquid-cooled cold plates thereof) via flexible hose connections 351, which are disposed between the supply manifold and the respective electronics subsystems within the rack. Similarly, system coolant return manifold 360 is coupled to the electronics subsystems via flexible hose connections 361. Quick connect couplings may be employed at the interface between flexible hoses 351, 361 and the individual electronics subsystems. By way of example, these quick connect couplings may comprise various types of commercially available couplings, such as those available from Colder Products Company, of St. Paul, Minn., USA, or Parker Hannifin, of Cleveland, Ohio, USA.

Although not shown, electronics rack 110 may also include an air-to-liquid heat exchanger disposed at an air outlet side thereof, which also receives system coolant from the system coolant supply manifold 350 and returns system coolant to the system coolant return manifold 360.

Figure 4:
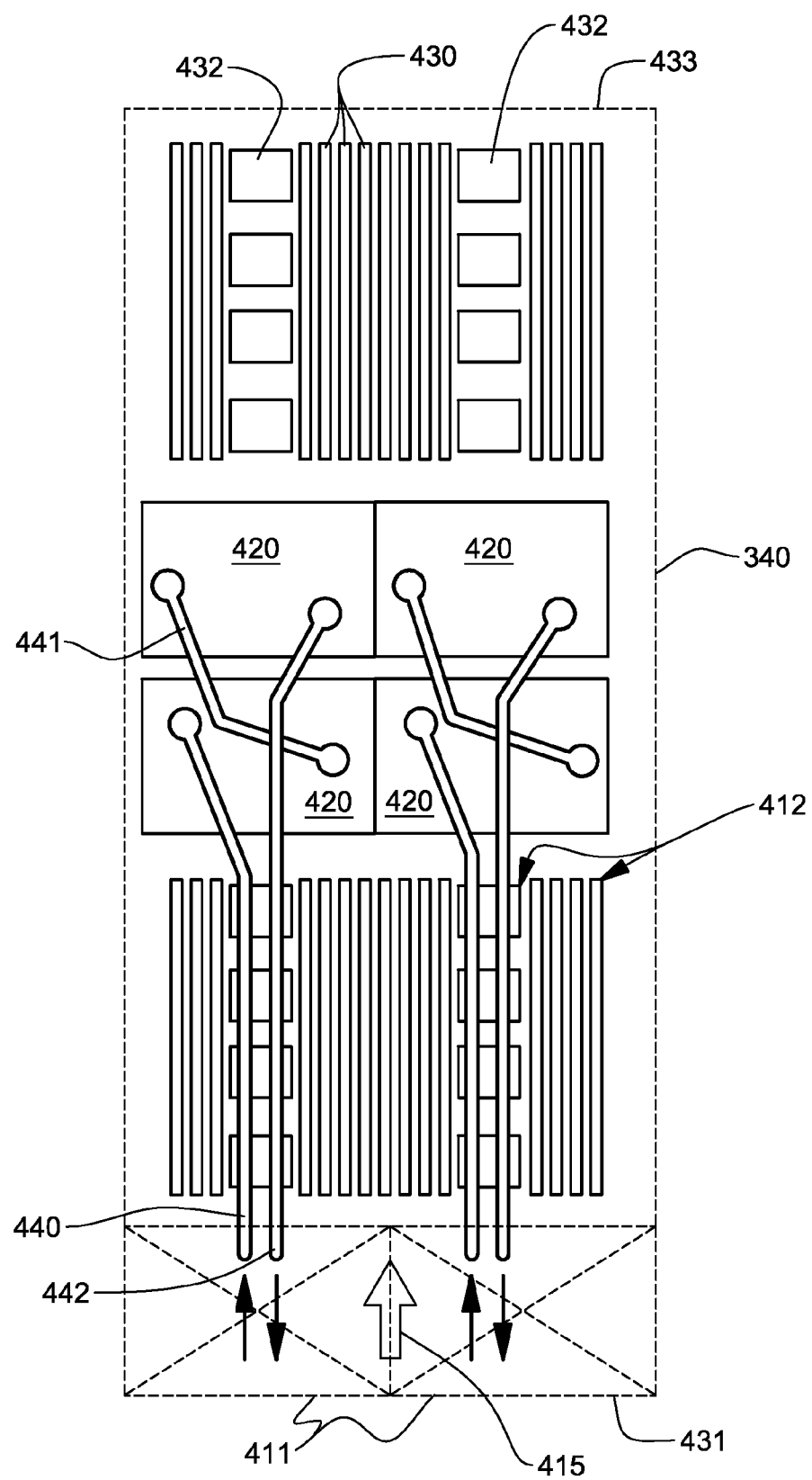
FIG. 4 is a plan view of one embodiment of an electronics subsystem layout illustrating an air and liquid cooling subsystem for hybrid cooling of components of the electronics subsystem, in accordance with an aspect of the present invention.

FIG. 4 depicts one embodiment of an electronics subsystem 340 component layout wherein one or more air moving devices 411 provide forced air flow 415 to cool multiple components 412 within electronics subsystem 340. Cool air is taken in through a front 431 and exhausted out a back 433 of the drawer. The multiple components to be cooled include multiple processor modules to which liquid-cooled cold plates 420 (of a liquid-based cooling system) are coupled, as well as multiple arrays of memory modules 430 (e.g., dual in-line memory modules (DIMMs)) and multiple rows of memory support modules 432 (e.g., DIMM control modules) to which air-cooled heat sinks are coupled. In the embodiment illustrated, memory modules 430 and the memory support modules 432 are partially arrayed near front 431 of electronics subsystem 340, and partially arrayed near back 433 of electronics subsystem 340. Also, in the embodiment of FIG. 4, memory modules 430 and the memory support modules 432 are cooled by air flow 415 across the electronics subsystem.

The illustrated liquid-based cooling system further includes multiple coolant-carrying tubes connected to and in fluid communication with liquid-cooled cold plates 420. The coolant-carrying tubes comprise sets of coolant-carrying tubes, with each set including (for example) a coolant supply tube 440, a bridge tube 441 and a coolant return tube 442. In this example, each set of tubes provides liquid coolant to a series-connected pair of cold plates 420 (coupled to a pair of processor modules). Coolant flows into a first cold plate of each pair via the coolant supply tube 440 and from the first cold plate to a second cold plate of the pair via bridge tube or line 441, which may or may not be thermally conductive. From the second cold plate of the pair, coolant is returned through the respective coolant return tube 442.

Figure 5:
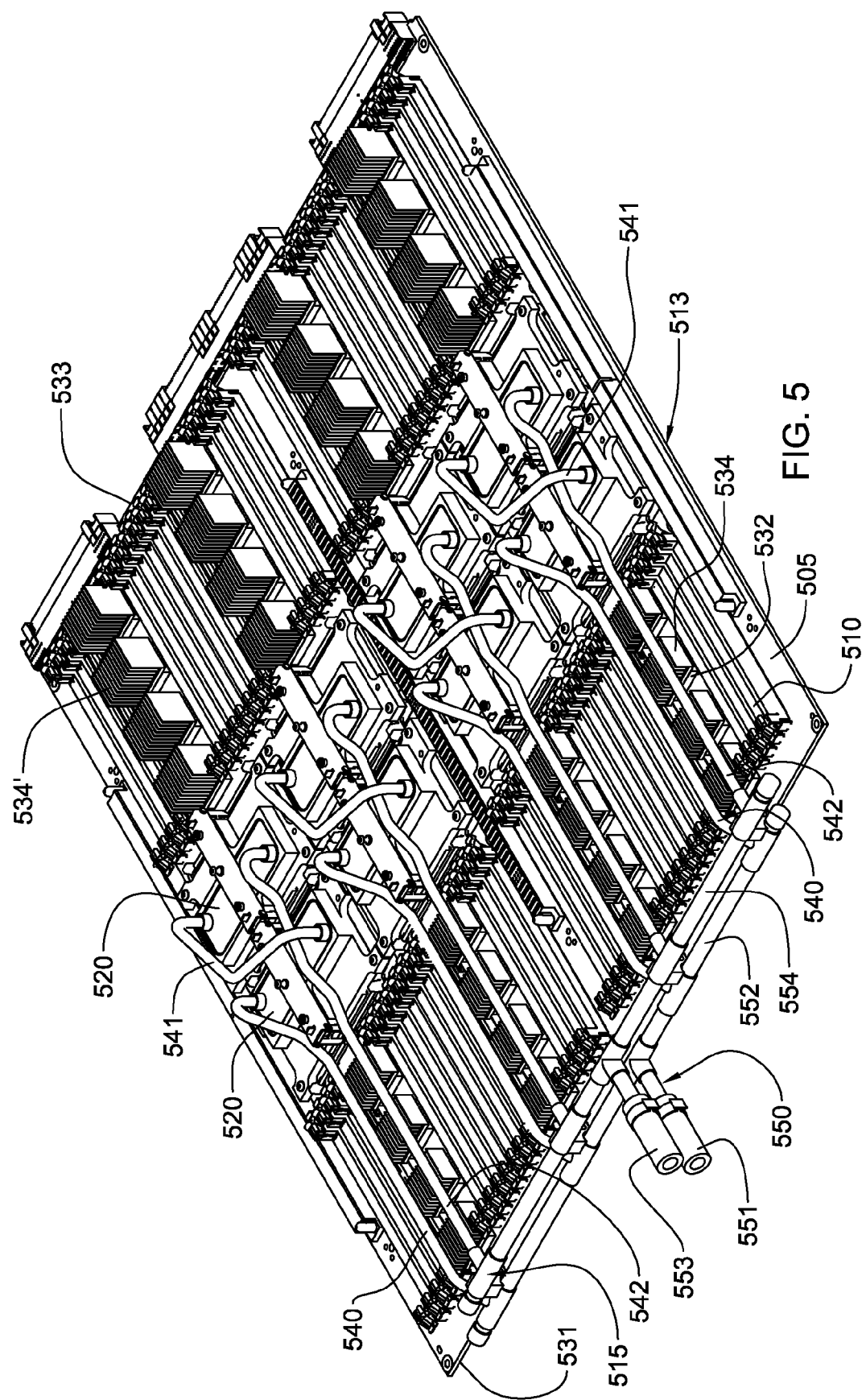
FIG. 5 depicts one detailed embodiment of a partially-assembled electronics subsystem layout, wherein the electronics subsystem includes eight heat-generating electronics components to be actively cooled, each having a respective liquid-cooled cold plate of a liquid-based cooling system coupled thereto, in accordance with an aspect of the present invention.

FIG. 5 depicts in greater detail an alternate electronics drawer layout comprising eight processor modules, each having a respective liquid-cooled cold plate of a liquid-based cooling system coupled thereto. The liquid-based cooling system is shown to further include associated coolant-carrying tubes for facilitating passage of liquid coolant through the liquid-cooled cold plates and a header subassembly to facilitate distribution of liquid coolant to and return of liquid coolant from the liquid-cooled cold plates. By way of specific example, the liquid coolant passing through the liquid-based cooling subsystem is chilled water.

As noted, various liquid coolants significantly outperform air in the task of removing heat from heat generating electronic components of an electronics system, and thereby more effectively maintain the components at a desirable temperature for enhanced reliability and peak performance. As liquid-based cooling systems are designed and deployed, it is advantageous to architect systems which maximize reliability and minimize the potential for leaks while meeting all other mechanical, electrical and chemical requirements of a given electronics system implementation. These more robust cooling systems have unique problems in their assembly and implementation. For example, one assembly solution is to utilize multiple fittings within the electronics system, and use flexible plastic or rubber tubing to connect headers, cold plates, pumps and other components. However, such a solution may not meet a given customer's specifications and need for reliability.

Thus, presented herein in one aspect is a robust and reliable liquid-based cooling system specially preconfigured and prefabricated as a monolithic structure for positioning within a particular electronics drawer.

FIG. 5 is an isometric view of one embodiment of an electronics drawer and monolithic cooling system, in accordance with an aspect of the present invention. The depicted planar server assembly includes a multi-layer printed circuit board to which memory DIMM sockets and various electronic components to be cooled are attached both physically and electrically. In the cooling system depicted, a supply header is provided to distribute liquid coolant from a single inlet to multiple parallel coolant flow paths and a return header collects exhausted coolant from the multiple parallel coolant flow paths into a single outlet. Each parallel coolant flow path includes one or more cold plates in series flow arrangement to cool one or more electronic components to which the cold plates are mechanically and thermally coupled. The number of parallel paths and the number of series-connected liquid-cooled cold plates depends, for example on the desired device temperature, available coolant temperature and coolant flow rate, and the total heat load being dissipated from each electronic component.

More particularly, FIG. 5 depicts a partially assembled electronics system 513 and an assembled liquid-based cooling system 515 coupled to primary heat generating components (e.g., including processor dies) to be cooled. In this embodiment, the electronics system is configured for (or as) an electronics drawer of an electronics rack, and includes, by way of example, a support substrate or planar board 505, a plurality of memory module sockets 510 (with the memory modules (e.g., dual in-line memory modules) not shown), multiple rows of memory support modules 532 (each having coupled thereto an air-cooled heat sink 534), and multiple processor modules (not shown) disposed below the liquid-cooled cold plates 520 of the liquid-based cooling system 515.

In addition to liquid-cooled cold plates 520, liquid-based cooling system 515 includes multiple coolant-carrying tubes, including coolant supply tubes 540 and coolant return tubes 542 in fluid communication with respective liquid-cooled cold plates 520. The coolant-carrying tubes 540, 542 are also connected to a header (or manifold) subassembly 550 which facilitates distribution of liquid coolant to the coolant supply tubes 540 and return of liquid coolant from the coolant return tubes 542. In this embodiment, the air-cooled heat sinks 534 coupled to memory support modules 532 closer to front 531 of electronics drawer 513 are shorter in height than the air-cooled heat sinks 534' coupled to memory support modules 532 near back 533 of electronics drawer 513. This size difference is to accommodate the coolant-carrying tubes 540, 542 since, in this embodiment, the header subassembly 550 is at the front 531 of the electronics drawer and the multiple liquid-cooled cold plates 520 are in the middle of the drawer.

Liquid-based cooling system 515 comprises a preconfigured monolithic structure which includes multiple (pre-assembled) liquid-cooled cold plates 520 configured and disposed in spaced relation to engage respective heat generating electronic components. Each liquid-cooled cold plate 520 includes, in this embodiment, a liquid coolant inlet and a liquid coolant outlet, as well as an attachment subassembly (i.e., a cold plate/load arm assembly). Each attachment subassembly is employed to couple its respective liquid-cooled cold plate 520 to the associated electronic component to form the cold plate and electronic component assemblies. Alignment openings (i.e., thru-holes) are provided on the sides of the cold plate to receive alignment pins or positioning dowels during the assembly process, as described further in the above-incorporated patent application entitled "Method of Assembling a Cooling System for a Multi-Component Electronics System". Additionally, connectors (or guide pins) are included within attachment subassembly which facilitate use of the attachment assembly.

As shown in FIG. 5, header subassembly 550 includes two liquid manifolds, i.e., a coolant supply header 552 and a coolant return header 554, which in one embodiment, are coupled together via supporting brackets. In the monolithic cooling structure of FIG. 5, the coolant supply header 552 is metallurgically bonded in fluid communication to each coolant supply tube 540, while the coolant return header 554 is metallurgically bonded in fluid communication to each coolant return tube 552. A single coolant inlet 551 and a single coolant outlet 553 extend from the header subassembly for coupling to the electronics rack's coolant supply and return manifolds (not shown).

FIG. 5 also depicts one embodiment of the preconfigured, coolant-carrying tubes. In addition to coolant supply tubes 540 and coolant return tubes 542, bridge tubes or lines 541 are provided for coupling, for example, a liquid coolant outlet of one liquid-cooled cold plate to the liquid coolant inlet of another liquid-cooled cold plate to connect in series fluid flow the cold plates, with the pair of cold plates receiving and returning liquid coolant via a respective set of coolant supply and return tubes. In one embodiment, the coolant supply tubes 540, bridge tubes 541 and coolant return tubes 542 are each preconfigured, semi-rigid tubes formed of a thermally conductive material, such as copper or aluminum, and the tubes are respectively brazed, soldered or welded in a fluid-tight manner to the header subassembly and/or the liquid-cooled cold plates. The tubes are preconfigured for a particular electronics system to facilitate installation of the monolithic structure in engaging relation with the electronics system.

The hybrid air and liquid coolant conditioning unit configurations depicted hereinbelow with reference to FIGS. 6-9 may be employed with air and liquid cooling subsystems such as described above in connection with FIGS. 4 & 5. Alternatively, the hybrid air and liquid coolant conditioning unit could be employed to either air-cool only or liquid-cool only the electronics racks, dependent on the data center implementation.

Figure 6:
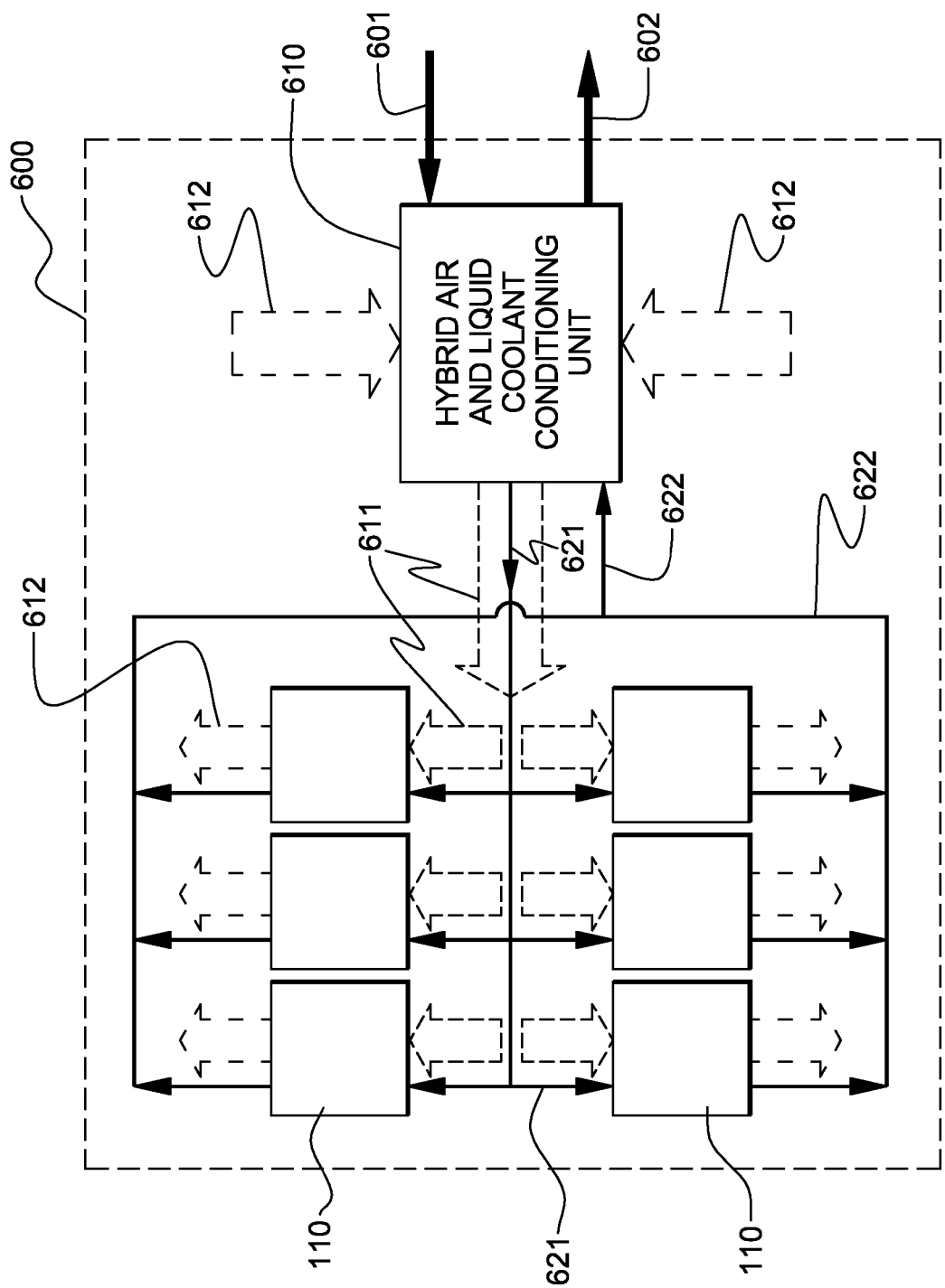
FIG. 6 is a plan view of one embodiment of a data center layout employing a hybrid air and liquid coolant conditioning unit, in accordance with an aspect of the present invention.

FIG. 6 depicts one embodiment of a data center 600 layout wherein multiple rows of electronics racks 110 are cooled employing a hybrid air and liquid coolant conditioning unit 610, in accordance with an aspect of the present invention. As shown, hybrid air and liquid coolant conditioning unit 610 receives (via a facility coolant supply line 601) chilled facility coolant and returns facility coolant (via a facility coolant return line 602) to a source. Cooled air 611 is output from the hybrid air and liquid coolant conditioning unit, for example, into a cold air plenum of a raised floor data center embodiment, such as depicted in FIG. 1. The cooled air 611 is produced by the hybrid air and liquid coolant conditioning unit extracting heat from warm data center air 612 being drawn through the hybrid air and liquid coolant conditioning unit, for example, by one or more air moving devices. This warm data center air 612 comprises, in part, air exhausted from the air outlet sides of the electronics racks within the data center. Hybrid air and liquid coolant conditioning unit 610 also outputs chilled system coolant (via a system coolant supply line 621) and receives system coolant from the electronics racks (via a system coolant return line 622). Together, system coolant supply line 621 and system coolant return line 622, and the structures in fluid communication therewith, define a system coolant loop between the electronics racks within the data center and the hybrid air and liquid coolant conditioning unit.

Figure 7:
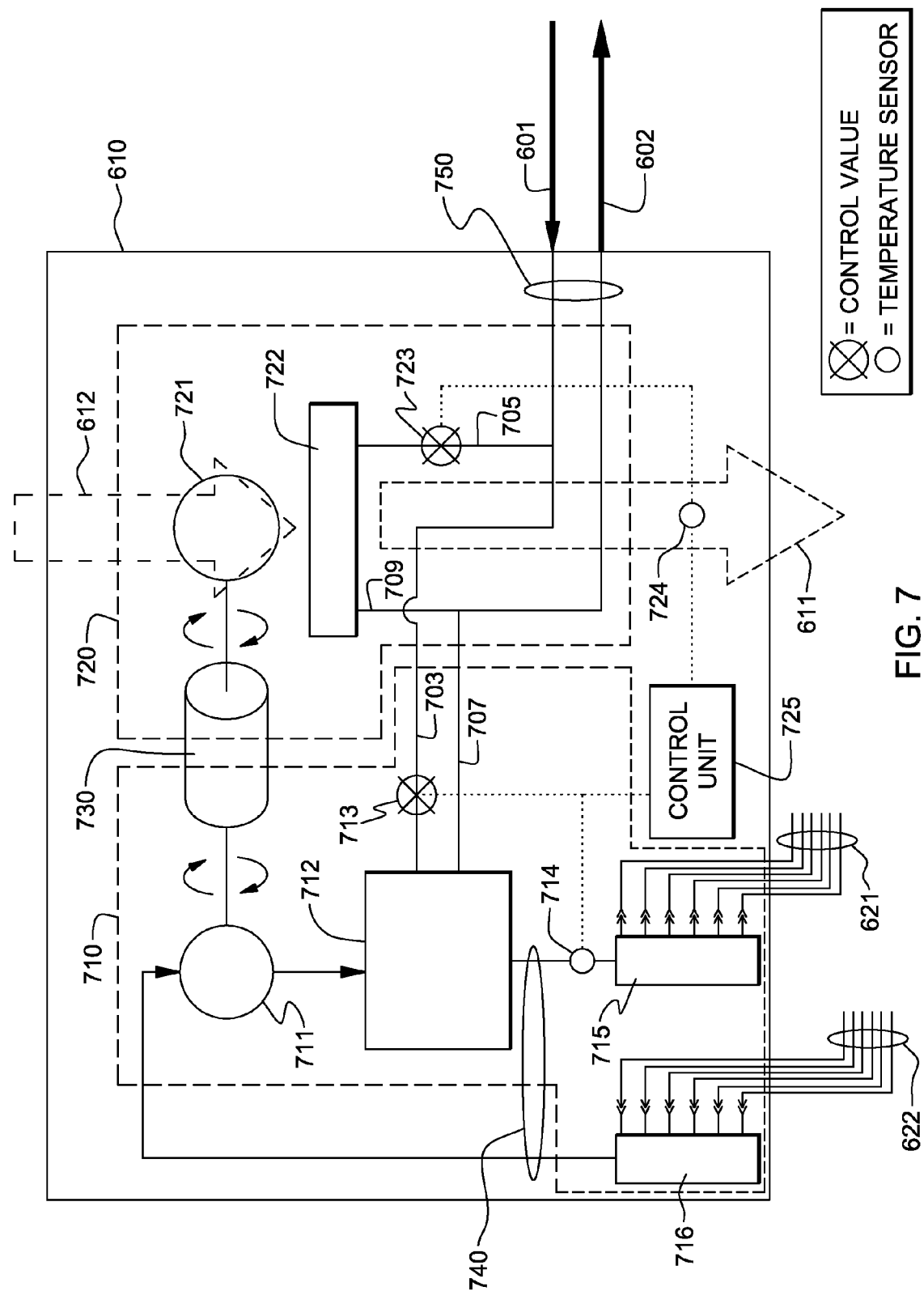
FIG. 7 is a schematic of one embodiment of a hybrid air and liquid coolant conditioning unit, in accordance with an aspect of the present invention.

FIG. 7 depicts one embodiment of hybrid air and liquid coolant conditioning unit 610. In this embodiment, the facility coolant is assumed to be, for example, chilled water received via facility coolant supply line 601 and returned via facility coolant return line 602. Together, these facility coolant lines, and the structures in fluid communication therewith, form a facility coolant loop 750.

As shown in FIG. 7, within hybrid air and liquid coolant conditioning unit 610 are a first heat exchange assembly 710 and a second heat exchange assembly 720. First heat exchange assembly 710 includes a system coolant loop 740 through which system coolant circulates between the first heat exchange assembly and the one or more electronics racks of the data center to be liquid-cooled. Additionally, first heat exchange assembly 710 includes a liquid-to-liquid heat exchanger 712 and a portion of facility coolant loop 750. When operational within the data center, facility coolant loop 750 receives chilled facility coolant from a source and passes at least a portion thereof through liquid-to-liquid heat exchanger 712, the portion being controlled by at least one first control valve 713 disposed (in this implementation) within a first facility coolant supply inlet line 703 to liquid-to-liquid heat exchanger 712. Similarly, a first facility coolant return outlet line 707 couples liquid-to-liquid heat exchanger 712 to facility coolant return line 602 of facility coolant loop 750.

System coolant loop 740 provides cooled system coolant to one or more electronics racks via a supply manifold 715 and one or more system coolant supply lines 621 coupling the hybrid air and liquid coolant conditioning unit to one or more electronics racks of the data center. Exhausted system coolant is returned via one or more system coolant return lines 622 from the one or more electronics racks through a return manifold 716 and a coolant pump 711 to liquid-to-liquid heat exchanger 712 where heat is expelled to the chilled facility coolant in the facility coolant loop 750. A first temperature sensor 714 is coupled to system coolant loop 740 to monitor temperature of system coolant within the loop, for example, at an outlet of the liquid-to-liquid heat exchanger 712, as illustrated. Sensed temperature values are provided to a control unit 725, which includes logic to automatically adjust facility coolant flow through liquid-to-liquid heat exchanger 712 employing the at least one first control valve 713. By increasing or decreasing facility coolant flow through liquid-to-liquid heat exchanger 712, temperature of system coolant in the system coolant loop can be adjusted, for example, to remain at a desired system coolant set point, or within a desired system coolant temperature range, such as above a room dew point temperature. One skilled in the art can readily implement logic to accomplish this automatic adjustment function. For example, the at least one first control valve 713 may be step-wise opened or closed, dependent on sensed temperature at the outlet of liquid-to-liquid heat exchanger 712 to either increase or decrease, respectively, facility coolant flow through the liquid-to-liquid heat exchanger.

Second heat exchange assembly 720 includes an air-moving device 721, an air-to-liquid heat exchanger 722 and a portion of facility coolant loop 750. When operational, air-moving device 721 moves warm data center air 612 across air-to-liquid heat exchanger 722, which extracts heat from the air and expels the heat to the chilled facility coolant in facility coolant loop 750. This heat originates, at least partially, with one or more electronics racks disposed within the data center room being air-cooled. Air-to-liquid heat exchanger 722 exhausts cooled air 611, for example, to a cold air plenum in a raised floor data center embodiment. Alternatively, the cooled air 611 could be exhausted directly into the data center to facilitate maintaining temperature of the data center at a desired temperature.

Second heat exchange assembly 720 also includes at least one second control valve 723 coupled to a second facility coolant supply inlet line 705, which is in fluid communication with facility coolant supply line 601. As shown, facility coolant supply line 601 provides facility coolant in parallel to liquid-to-liquid heat exchanger 712 of first heat exchange assembly 710 and to air-to-liquid heat exchanger 722 of second heat exchange assembly 720 via first facility coolant supply inlet line 703 and second facility coolant supply inlet line 705, respectively. Similarly, second heat exchange assembly 712 includes a second facility coolant return outlet line 709 in fluid communication with facility coolant return line 602 for exhausting facility coolant for return, for example, to the facility coolant source (not shown). Second heat exchange assembly 720 also includes a second temperature sensor 724 for sensing air temperature within the data center. For example, second temperature sensor 724 could be disposed in the raised floor cold air plenum in the embodiment of FIG. 1. As with the first heat exchange assembly, control unit 725 is coupled to the second temperature sensor 724 and to the at least one second control valve 723 for automatically adjusting facility coolant flow through the air-to-liquid heat exchanger, thereby controlling air temperature expelled from the second heat exchange assembly to facilitate cooling of the electronics rack within the data center. One skilled in the art can again readily implement logic within control unit 725 to accomplish this temperature monitoring and control valve adjusting function. In one implementation, control valves 713, 723 are motor driven control valves.

In the embodiment illustrated in FIG. 7, a motor 730 simultaneously drives pump 711 of first heat exchange assembly 710 and air-moving device 721 of second heat exchange assembly 720. This may be accomplished, for example, by employing a double-shafted motor, such as available from AmericanHVACParts.com of Rancho Cucamonga, Calif., USA. In another implementation, an off the shelf transmission could be employed which accepts a single rotating shaft torque input and through a set of internal gears outputs one, two, or several rotating torque outputs at whatever desired speeds are requested. Another approach is to use a motor equipped with a pulley or sprocket, and equip each pump and air-moving device with a receiving pulley or sprocket (sized to achieve the appropriate shaft speed for the pump or air-moving device). The motor and pump(s) and air-moving device(s) would then be connected by a belt or chain (among the pulleys or sprockets, respectively).

Figure 8:
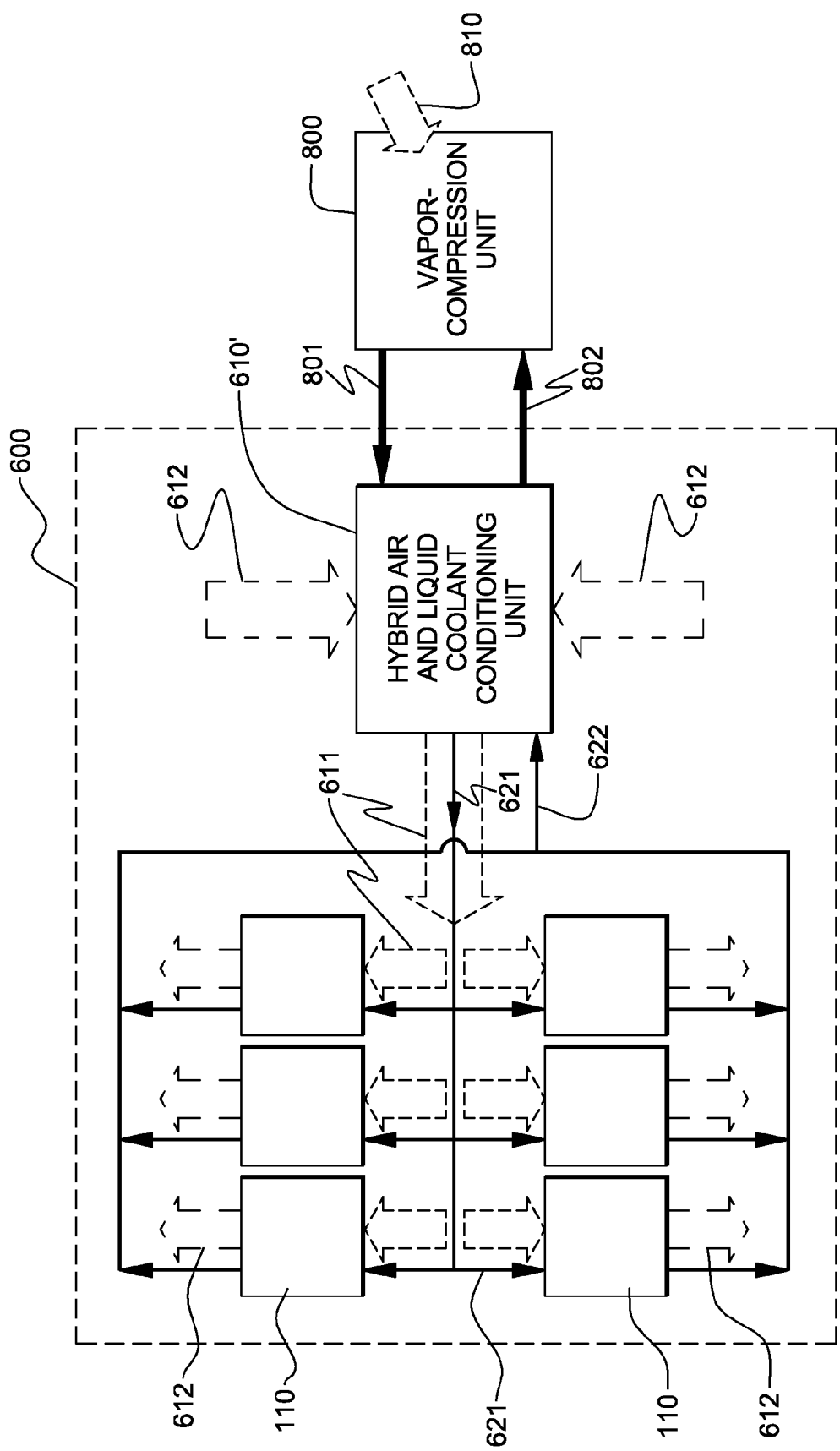
FIG. 8 is a plan view of one embodiment of a data center layout employing an alternate hybrid air and liquid coolant conditioning unit, in accordance with an aspect of the present invention.

FIG. 8 depicts an alternate hybrid air and liquid coolant conditioning unit 610' for data center 600, which again includes one or more rows of electronics racks 110 to be air and/or liquid-cooled. Hybrid air and liquid coolant conditioning unit 610' again provides cooled air 611 for air-cooling of the one or more electronics racks, and provides system coolant via a system coolant loop (comprising system coolant supply line 621 and system coolant return line 622) to the one or more electronics racks. Electronics racks 110 employ air-moving devices, for example, within the respective racks, to draw cool air from a cold air aisle within the data center through the one or more electronics subsystems of the rack for exhausting out an air outlet side thereof as warm air 612, which is then drawn back to the hybrid and air and liquid coolant conditioning unit, for example, via one or more air-moving devices disposed within the hybrid air and liquid coolant conditioning unit.

In this embodiment, the hybrid air and liquid coolant conditioning unit 610' comprises a vapor-compression heat exchange assembly which, as shown, includes a vapor-compression unit 800 disposed outside data center 600. Vapor-compression unit 800 includes a compressor and a condenser disposed in fluid communication with a facility coolant loop comprising a facility coolant supply line 801 and a facility coolant return line 802. In this embodiment, the facility coolant is a refrigerant flowing through the facility coolant loop. The condenser of vapor-compression unit 800 is one of an air-cooled condenser unit (e.g., employing outdoor air 810 for cooling) or a liquid-cooled condenser unit (e.g., employing chilled water (not shown)).

Figure 9:
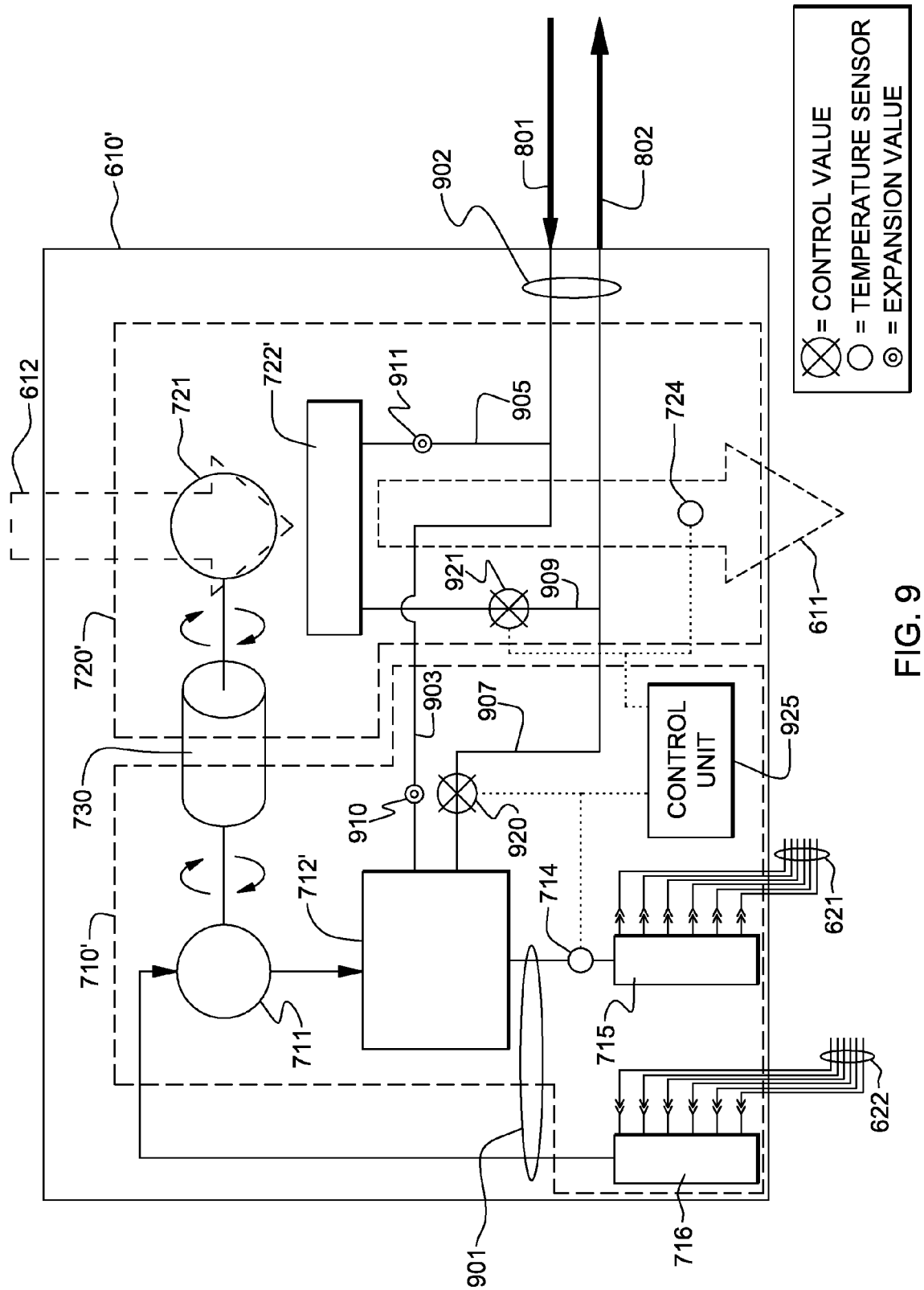
FIG. 9 is a schematic of one embodiment of the alternate hybrid air and liquid coolant conditioning unit of FIG. 8, in accordance with an aspect of the present invention.

FIG. 9 depicts one implementation of the hybrid air and liquid coolant conditioning unit 610' of FIG. 8, wherein the liquid-to-liquid heat exchanger 712' functions as a system coolant conditioning evaporator, and the air-to-liquid heat exchanger 722' functions as an air-conditioning evaporator. As shown in FIG. 9, the facility coolant loop 902, comprising facility coolant supply line 801 and facility coolant return line 802, includes a first facility coolant supply inlet line 903 and a second facility coolant supply inlet line 905 coupling facility coolant supply line 801 to the respective heat exchangers. Each facility coolant supply inlet line 903, 905 includes a respective expansion valve 910, 911 through which facility coolant passes.

In operation, the vapor-compression heat exchange system uses a circulating refrigerant as the medium which absorbs and removes heat from air and system coolant egressing from one or more electronics racks of the data center, and subsequently rejects the heat via the condenser of the vapor-compression unit. Circulating refrigerant enters the compressor (not shown) of the vapor-compression unit (see FIG. 8) in the thermodynamic state known as a saturated or superheated vapor and is compressed to a higher pressure, resulting in a higher temperature as well. The hot, compressed vapor is then in the thermodynamic state known as a super-heated vapor and it is at a temperature and pressure at which it can be condensed with typically available cooling water or cooling air. The hot vapor is routed through a condenser (not shown) of the vapor-compression unit (see FIG. 8) where it is cooled and condensed into a liquid by flowing through a coil or tubes with cool water or cool air flowing across the coil or tubes. This is where the circulating refrigerant rejects heat from the system and the rejected heat is carried away by either the water or the air, depending on the vapor-compression unit implementation.

The condensed liquid refrigerant, in the thermodynamic state known as a saturated liquid, is next routed through one of the expansion valves 910, 911, which as noted above, are disposed in the facility coolant supply inlet lines 903, 905, respectively. Passing through the expansion valve, the refrigerant undergoes an abrupt reduction in pressure. This pressure reduction results in the flash evaporation of a part of the liquid refrigerant. The auto-refrigeration effect of flash evaporation further lowers the temperature of the liquid and vapor-refrigerant mixture. The cold mixture is then routed through an evaporator (i.e., the liquid-to-liquid heat exchanger and/or the air-to-liquid heat exchanger). Warm system coolant is pumped via pump 711 in the first heat exchange assembly 710' through liquid-to-liquid heat exchanger 712', and air-moving device 721 of second heat exchange assembly 720' establishes a warm airflow across air-to-liquid heat exchanger 722'. The warm system coolant and the warm airflow pass through the respective heat exchangers, with cold system coolant being output in the system coolant loop 901 from liquid-to-liquid heat exchanger 712', and cooled air 611 egressing from the air-to-liquid heat exchanger 722'. The warm system coolant and warm air passing through the respective heat exchangers evaporates the liquid part of the cold refrigerant mixture within the evaporator coil (i.e., the heat exchanger). At the same time, the system coolant is cooled, and the circulating air is cooled, thus lowering the temperature of the system coolant and the air output from the hybrid air and liquid coolant conditioning unit, respectively. The heat exchangers (i.e., evaporator coils), are thus where the circulating refrigerant absorbs and removes heat, which is subsequently rejected in the condenser and transferred elsewhere by the water or air used to cool the condenser. The refrigeration cycle then repeats, with the refrigerant vapor from the evaporators being routed back to the compressor of the vapor-compression unit.

As shown in FIG. 9, first heat exchange assembly 710' further includes at least one first control valve 920, disposed in communication with facility coolant return outlet line 907 coupled to liquid-to-liquid heat exchanger 712', and a first temperature sensor 714, disposed in communication with system coolant loop 901 for sensing system coolant temperature, for example, at an outlet of the liquid-to-liquid heat exchanger 712', as illustrated. A control unit 925 is coupled to the at least one first control valve 920 and first temperature sensor 714 for adjusting flow of facility coolant through the at least one first control valve 920, dependent, for example, on sensed temperature of system coolant within system coolant loop 901. By locating the at least one first control valve 920 downstream from liquid-to-liquid heat exchanger 712', the control valve may be employed to control saturation pressure of refrigerant within the heat exchanger. As pressure of refrigerant within the heat exchanger (or more particularly, the evaporator), is adjusted, saturation temperature of the refrigerant is also adjusted. If desired, expansion valves 910, 911 may be also adjustable, in which case control unit 925 is also coupled to expansion valve 910 for directly controlling, for example, an orifice size of the expansion valve. Similarly, control unit 925 is coupled to at least one second control valve 921 and to a second temperature sensor 724 of second heat exchange assembly 720'. As illustrated, the at least one second control valve 921 is located in a second facility coolant return outlet line 909 coupling air-to-liquid heat exchanger 722' to the facility coolant return line 802 of the facility coolant loop 902. This again allows control unit 925 to control saturation pressure of refrigerant within the air-to-liquid heat exchanger 722' by controlling the at least one second control valve 921 dependent, for example, on a sensed air temperature obtained from second temperature sensor 724. Additionally, expansion valve 911 may be controllable, in which case the valve would be coupled to control unit 925, for example, for automatic adjustment of an orifice size within the expansion valve.

As in the embodiment of FIG. 7, a single motor 730 may again simultaneously drive pump 711 of first heat exchange assembly 710' and air-moving device 721 of second heat exchange assembly 720'. In an alternate embodiment, separate motors may be employed to drive pump 711 of first heat exchange assembly 710' and air-moving device 721 of second heat exchange assembly 720'.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. An apparatus facilitating cooling of at least one electronics rack of a data center, the apparatus comprising:
   a hybrid air and liquid coolant conditioning unit disposed separate from the at least one electronics rack, the hybrid and liquid coolant conditioning unit comprising:
   a first heat exchange assembly comprising a liquid-to-liquid heat exchanger, a system coolant pipe loop and a facility coolant pipe loop, wherein the facility coolant pipe loop is connected to and receives chilled facility coolant from a data center source external to the hybrid air and liquid coolant conditioning unit and the at least one electronics rack, and is connected to the liquid-to-liquid heat exchanger and passes at least a portion thereof through the liquid-to-liquid heat exchanger, and the system coolant pipe loop is connected in fluid communication with the at least one electronics rack disposed separate from the hybrid air and liquid coolant conditioning unit, and providing cooled system coolant to the at least one electronics rack, and expelling heat via the liquid-to-liquid heat exchanger from the at least one electronics rack to the chilled facility coolant in the facility coolant pipe loop;
   a second heat exchange assembly, the second heat exchange assembly comprising an air-to-liquid heat exchanger, an air-moving device, and the facility coolant pipe loop, the air-moving device moving air across the air-to-liquid heat exchanger, wherein the facility coolant pipe loop is connected to the air-to-liquid heat exchanger and passing at least a portion of the chilled facility coolant through the air-to-liquid heat exchanger, the air-to-liquid heat exchanger extracting heat from air of the data center moving across the air-to-liquid heat exchanger and expelling the heat to the chilled facility coolant in the facility coolant pipe loop, thereby facilitating air cooling of the at least one electronics rack disposed separate from the hybrid air and liquid coolant conditioning unit, wherein the facility coolant pipe loop is connected to and provides chilled facility coolant in parallel to the liquid-to-liquid heat exchanger of the first heat exchange assembly and to the air-to-liquid heat exchanger of the second heat exchange assembly; and at least one control valve disposed within the facility coolant pipe loop, wherein the facility coolant pipe loop feeds facility coolant in parallel to a first facility coolant supply inlet line coupled to the liquid-to-liquid heat exchanger and a second facility coolant supply inlet line coupled to the air-to-liquid heat exchanger, and wherein the at least one control valve is coupled to at least one of the first facility coolant supply inlet line or the second facility coolant supply inlet line and separately controlling facility coolant flow through at least one of the liquid-to-liquid heat exchanger or the air-to-liquid heat exchanger.

2. The apparatus of claim 1, wherein the at least one control valve comprises at least one first control valve, the at least one first control valve being coupled to the first facility coolant supply inlet line and facilitating adjustment of facility coolant flow through the liquid-to-liquid heat exchanger to control temperature of system coolant in the system coolant pipe loop in fluid communication with the at least one electronics rack, and wherein the hybrid air and liquid coolant conditioning unit further comprises at least one second control valve coupled to the second facility coolant inlet line and facilitating adjustment of facility coolant flow through the air-to-liquid heat exchanger to control of an amount of cooling applied to the air of the data center moving across the air-to-liquid heat exchanger.

3. The apparatus of claim 1, wherein the facility coolant pipe loop comprises a facility coolant return line, the facility coolant return line receiving in parallel facility coolant from a first facility coolant return outlet line coupled to the liquid-to-liquid heat exchanger and a second facility coolant return outlet line coupled to the air-to-liquid heat exchanger, and wherein the at least one control valve comprises at least one first control valve coupled to the first facility coolant return outlet line and facilitating adjustment of facility coolant flow through the liquid-to-liquid heat exchanger to control temperature of system coolant in the system coolant pipe loop, and wherein the hybrid air and liquid coolant conditioning unit further comprises at least one second control valve coupled to the second facility coolant return outlet line and facilitating adjustment of facility coolant flow through the air-to-liquid heat exchanger to control cooling applied to the air of the data center moving across the air-to-liquid heat exchanger.

4. The apparatus of claim 1, further comprising a first temperature sensor coupled to the system coolant pipe loop for sensing temperature of system coolant therein, and wherein the apparatus further comprises a control unit, coupled to the at least one control valve and to the first temperature sensor, which automatically adjusts facility coolant flow through the liquid-to-liquid heat exchanger dependent on a sensed temperature of system coolant within the system coolant loop ascertained via the first temperature sensor.

5. The apparatus of claim 4, further comprising a second temperature sensor disposed to sense an air temperature within the data center, and wherein the control unit is coupled to the second temperature sensor and automatically adjusts flow of facility coolant through the air-to-liquid heat exchanger dependent on a sensed air temperature ascertained via the second temperature sensor.

6. The apparatus of claim 1, wherein the first heat exchange assembly further comprises a coolant pump in fluid communication with the system coolant loop for pumping system coolant therethrough, and wherein the apparatus further comprises a motor coupled to simultaneously drive the coolant pump of the first heat exchange assembly and the air-moving device of the second heat exchange assembly to facilitate simultaneous provision of cooled system coolant to the at least one electronics rack and cooled air to the at least one electronics rack.

7. A data center comprising:
at least one electronics rack, each electronics rack of the at least one electronics rack comprising at air inlet side and an air outlet side, the air inlet and outlet sides respectively enabling ingress and egress of air through the electronics rack; and
a hybrid air and liquid coolant conditioning unit disposed separate from the at least one electronics rack, the hybrid air and liquid coolant conditioning unit comprising:
a first heat exchange assembly comprising a liquid-to-liquid heat exchanger, a system coolant pipe loop and a portion of a facility coolant pipe loop, wherein the facility coolant pipe loop is connected to and receives chilled facility coolant from a data center source external to the hybrid air and liquid coolant conditioning unit and the at least one electronics rack, and is connected to the liquid-to-liquid heat exchanger and passes at least a portion thereof through the liquid-to-liquid heat exchanger, and the system coolant pipe loop is connected in fluid communication with the at least one electronics rack disposed separate from the hybrid air and liquid coolant conditioning unit, and providing cooled system coolant to the at least one electronics rack, and expelling heat via the liquid-to-liquid heat exchanger from the at least one electronics rack to the chilled facility coolant in the facility coolant pipe loop;
a second heat exchange assembly, the second heat exchange assembly comprising an air-to-liquid heat exchanger, an air-moving device, and a portion of the facility coolant pipe loop, the air-moving device for moving air across the air-to-liquid heat exchanger, wherein the facility coolant pipe loop is connected to the air-to-liquid heat exchanger and passing at least a portion of the chilled facility coolant through the air-to-liquid heat exchanger, the air-to-liquid heat exchanger extracting heat from air of the data center moving across the air-to-liquid heat exchanger and expelling the heat to the chilled facility coolant in the facility coolant pipe loop, thereby facilitating air cooling of the at least one electronics rack disposed separate from the hybrid air and liquid coolant conditioning unit, wherein the facility coolant pipe loop is connected to and provides chilled facility coolant in parallel to the liquid-to-liquid heat exchanger of the first heat exchange assembly and to the air-to-liquid heat exchanger of the second heat exchange assembly; and
at least one control valve disposed within the facility coolant pipe loop, wherein the facility coolant pipe loop feeds facility coolant in parallel to a first facility coolant supply inlet line coupled to the liquid-to-liquid heat exchanger and a second facility coolant supply inlet line coupled to the air-to-liquid heat exchanger, and wherein the at least one control valve is coupled to at least one of the first facility coolant supply inlet line or the second facility coolant supply inlet line and separately controlling facility coolant flow through at least one of the liquid-to-liquid heat exchanger or the air-to-liquid heat exchanger.

8. The data center of claim 7, wherein the at least one control valve comprises at least one first control valve, the at least one first control valve being coupled to the first facility coolant supply inlet line and facilitating adjustment of facility coolant flow through the liquid-to-liquid heat exchanger to control temperature of system coolant in the system coolant pipe loop in fluid communication with the at least one electronics rack, and wherein the hybrid air and liquid coolant conditioning unit further comprises at least one second control valve coupled to the second facility coolant inlet line and facilitating adjustment of facility coolant flow through the air-to-liquid heat exchanger to control of an amount of cooling applied to the air of the data center moving across the air-to-liquid heat exchanger.

9. The data center of claim 7, wherein the facility coolant pipe loop comprises a facility coolant return line, the facility coolant return line receiving in parallel facility coolant from a first facility coolant return outlet line coupled to the liquid-to-liquid heat exchanger and a second facility coolant return outlet line coupled to the air-to-liquid heat exchanger, and wherein the at least one control valve comprises at least one first control valve coupled to the first facility coolant return outlet line and facilitating adjustment of facility coolant flow through the liquid-to-liquid heat exchanger to control temperature of system coolant in the system coolant pipe loop, and wherein the hybrid air and liquid coolant conditioning unit further comprises at least one second control valve coupled to the second facility coolant return outlet line and facilitating adjustment of facility coolant flow through the air-to-liquid heat exchanger to control cooling applied to the air of the data center moving across the air-to-liquid heat exchanger.

10. The data center of claim 9, wherein the hybrid air and liquid coolant conditioning unit further comprises a first temperature sensor coupled to the system coolant pipe loop for sensing temperature of system coolant therein, and a second temperature sensor disposed to sense an air temperature within the data center, and a control unit coupled to the at least one first control valve; the first temperature sensor, the at least one second control valve, and the second temperature sensor and automatically adjusting facility coolant flow through the liquid-to-liquid heat exchanger dependent on sensed temperature of system coolant within the system coolant loop ascertained via the first temperature sensor, and automatically adjusting facility coolant flow through the air-to-liquid heat exchanger dependent on sensed data center air temperature ascertained via the second temperature sensor.

11. The data center of claim 7, wherein the first heat exchange assembly further comprises a coolant pump in fluid communication with the system coolant loop for pumping system coolant therethrough, and wherein the hybrid air and liquid coolant conditioning unit further comprises a motor coupled to simultaneously drive the coolant pump of the first heat exchange assembly and the air-moving device of the second heat exchange assembly to facilitate simultaneous provision of cooled system coolant to the at least one electronics rack and cooled air to the at least one electronics rack.

12. The apparatus of claim 1, wherein the hybrid air and liquid coolant conditioning unit comprises a vapor-compression heat exchange assembly, and wherein the facility coolant comprises a refrigerant, and the liquid-to-liquid heat exchanger of the first heat exchange assembly functions as a system coolant conditioning evaporator, and the air-to-liquid heat exchanger of the second heat exchange assembly functions as an air-conditioning evaporator, and wherein the first heat exchange assembly further comprises a first expansion valve disposed within a first facility cool ant supply inlet line, and the second. heat exchange assembly comprises a second expansion valve disposed within a second facility coolant supply inlet line, and wherein the vapor-compression heat exchange assembly further comprises a vapor-compression unit comprising a compressor and a condenser, the vapor-compression unit being in fluid communication with the first expansion valve, the liquid-to-liquid heat exchanger, the second expansion valve and the air-to-liquid heat exchanger via the facility coolant loop for exhausting heat from refrigerant circulating therethrough.

13. The apparatus of claim 12, wherein the at least one control valve comprises at least one first control valve disposed within a first facility coolant return outlet line coupled to the liquid-to-liquid heat exchanger, and wherein the hybrid air and liquid coolant conditioning unit further comprises at least one second control valve, the at least one second control valve allowing adjustment of facility coolant flow through the air-to-liquid heat exchanger, thereby allowing control of an amount of cooling applied to the air of the data center moving across the air-to-liquid heat exchanger, and wherein the at least one second control valve is disposed within a second facility coolant return outlet line coupled to the air-to-liquid heat exchanger, and wherein the apparatus further comprises a control unit coupled to the at least one first control valve and the at least one second control valve for automatically controlling saturation pressure, and hence temperature, of refrigerant within the liquid-to-liquid heat exchanger and within the air-to-liquid heat exchanger.

14. The apparatus of claim 13, further comprising a first temperature sensor coupled to the system coolant loop for sensing system coolant temperature, and a second temperature sensor for sensing an air temperature within the data center, and wherein the control unit is coupled to the first temperature sensor and to the second temperature sensor for adjusting, based on one or more sensed temperature values therefrom, at least one of the at least one first control valve or the at least one second control valve.

15. The apparatus of claim 12, wherein the vapor-compression unit is configured for disposition outside the data center containing the at least one electronics rack, and wherein the condenser of the vapor-compression unit is one of an air-cooled condenser unit or a liquid-cooled condenser unit.

16. The data center of claim 11, wherein the hybrid air and liquid coolant conditioning unit comprises a vapor-compression heat exchange assembly, and wherein the facility coolant comprises a refrigerant, and the liquid-to-liquid heat exchanger of the first heat exchange assembly functions as a system coolant conditioning evaporator, and the air-to-liquid heat exchanger of the second heat exchange assembly functions as an air-conditioning evaporator, and wherein the first heat exchange assembly further comprises a first expansion valve disposed within a first facility coolant supply inlet line, and the second heat exchange assembly comprises a second expansion valve disposed within a second facility coolant supply inlet line, and wherein the vapor-compression heat exchange assembly further comprises a vapor-compression unit comprising a compressor and a condenser, the vapor-compression, unit being in fluid communication with the first expansion valve, the liquid-to-liquid heat exchanger, the second expansion valve and the air-to-liquid heat exchanger via the facility coolant loop for exhausting heat from refrigerant circulating therethrough.

17. The data center of claim 16, wherein the at least one control valve comprises at least one first control valve disposed within a first facility coolant return outlet line coupled to the liquid-to-liquid heat exchanger, and wherein the hybrid air and liquid coolant conditioning unit further comprises at least one second control valve, the at least one second control valve allowing adjustment of facility coolant flow through the air-to-liquid heat exchanger, thereby allowing control of an amount of cooling applied to the air of the data center moving across the air-to-liquid heat exchanger, and wherein the at least one second control valve is disposed within a second facility coolant return outlet line coupled to the air-to-liquid heat exchanger, and wherein the apparatus further comprises a control unit coupled to the at least one first control valve and the at least one second control valve for automatically controlling saturation pressure, and hence temperature, of refrigerant within the liquid-to-liquid heat exchanger and within the air-to-liquid heat exchanger.

18. The data center of claim 17, further comprising a first temperature sensor coupled to the system coolant loop for sensing system coolant temperature, and a second temperature sensor for sensing an air temperature within the data center, and wherein the control unit is coupled to the first temperature sensor and to the second temperature sensor for adjusting, based on one or more sensed temperature values therefrom, at least one of the at east one first control valve or the at least one first control valve or the at least one second control valve.

* * * * *